US011275474B2

(12) United States Patent
Yang et al.

(10) Patent No.: US 11,275,474 B2
(45) Date of Patent: Mar. 15, 2022

(54) ELECTRONIC PANEL AND DISPLAY DEVICE INCLUDING THE SAME

(71) Applicant: Samsung Display Co., Ltd., Yongin-Si (KR)

(72) Inventors: Sung-Jin Yang, Cheonan-si (KR); Chungi You, Asan-si (KR); Hyunsik Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/024,803

(22) Filed: Sep. 18, 2020

(65) Prior Publication Data

US 2021/0223910 A1 Jul. 22, 2021

(30) Foreign Application Priority Data

Jan. 20, 2020 (KR) .................. 10-2020-0007405

(51) Int. Cl.
*G06F 3/044* (2006.01)
*H01L 27/32* (2006.01)

(52) U.S. Cl.
CPC .......... *G06F 3/0443* (2019.05); *G06F 3/0446* (2019.05); *H01L 27/323* (2013.01); *G06F 2203/04107* (2013.01)

(58) Field of Classification Search
CPC ................. G06F 3/0443; G06F 3/0446; G06F 2203/04107; H01L 27/323
See application file for complete search history.

(56) References Cited

U.S. PATENT DOCUMENTS 8,982,078 B2 * 3/2015 Kim ................. G06F 3/0418
345/173
9,182,866 B2 * 11/2015 Inagaki ............. G06F 3/0443
2010/0182275 A1 * 7/2010 Saitou .............. G06F 3/0446
345/174

(Continued)

FOREIGN PATENT DOCUMENTS

KR            10-1082293       11/2011
KR     10-2018-0025533         3/2018
(Continued)

*Primary Examiner* — Amy Onyekaba
(74) *Attorney, Agent, or Firm* — F. Chau & Associates, LLC

(57) ABSTRACT

An electronic panel includes: a plurality of sensing electrodes that overlap a sensing area; a line section that overlaps a peripheral area adjacent to the sensing area, wherein the line section includes a plurality of first lines and a plurality of second lines, wherein the plurality of first lines are respectively connected to first ends of the sensing electrodes, and the plurality of second lines are respectively connected to second ends of the sensing electrodes; an insulation layer disposed between the first lines and the second lines, wherein the insulation layer defines a plurality of contact holes through which the first lines are electrically connected to corresponding second lines; and an electrostatic shield pattern disposed on the insulation layer on which the second lines are disposed, wherein the electrostatic shield pattern is electrically connected to one of the first lines through a guide contact hole defined in the insulation layer.

20 Claims, 12 Drawing Sheets

(56) References Cited

U.S. PATENT DOCUMENTS

| | | | | |
|---|---|---|---|---|
| 2010/0220071 A1* | 9/2010 | Nishihara | | G06F 3/0443 345/173 |
| 2011/0057893 A1* | 3/2011 | Kim | | G06F 3/0445 345/173 |
| 2011/0090159 A1* | 4/2011 | Kurashima | | G06F 3/0446 345/173 |
| 2013/0106747 A1* | 5/2013 | Choi | | G06F 3/0443 345/173 |
| 2014/0071064 A1* | 3/2014 | Cho | | G06F 3/0443 345/173 |
| 2014/0184950 A1* | 7/2014 | Chu | | G06F 3/041 349/12 |
| 2014/0375910 A1* | 12/2014 | Tada | | G06F 1/1692 349/12 |
| 2015/0227235 A1* | 8/2015 | Lee | | G06F 3/04164 345/174 |
| 2016/0103548 A1* | 4/2016 | Jun | | G06F 3/04164 345/173 |
| 2016/0188114 A1* | 6/2016 | Kim | | G06F 3/0446 345/174 |
| 2017/0103247 A1* | 4/2017 | Mizuhashi | | G06K 9/0002 |
| 2017/0115775 A1* | 4/2017 | Wu | | H01L 29/78633 |
| 2017/0213849 A1* | 7/2017 | Li | | H01L 27/32 |
| 2017/0277931 A1* | 9/2017 | Uehara | | G06F 3/044 |
| 2017/0351360 A1* | 12/2017 | Kurashima | | G06F 3/0446 |
| 2017/0371464 A1* | 12/2017 | Nakanishi | | H01L 27/323 |
| 2018/0018051 A1* | 1/2018 | Ogura | | G06F 3/0412 |
| 2018/0059473 A1* | 3/2018 | Uchida | | G02F 1/13452 |
| 2018/0164919 A1* | 6/2018 | Lim | | G06F 3/04164 |
| 2018/0231853 A1* | 8/2018 | Yamamoto | | G06F 3/0446 |
| 2019/0237533 A1* | 8/2019 | Kim | | H01L 51/5246 |
| 2020/0027929 A1* | 1/2020 | Lee | | G06F 3/04164 |
| 2021/0081637 A1* | 3/2021 | Tada | | H05K 1/02 |
| 2021/0256238 A1* | 8/2021 | Mizuhashi | | G06F 3/0446 |

FOREIGN PATENT DOCUMENTS

| | | |
|---|---|---|
| KR | 10-2018-0069623 | 6/2018 |
| KR | 10-1976089 | 5/2019 |

* cited by examiner

ELECTRONIC PANEL AND DISPLAY DEVICE INCLUDING THE SAME

CROSS-REFERENCE TO RELATED APPLICATION

This U.S. nonprovisional application claims priority under 35 U.S.C. § 119 to Korean Patent Application No. 10-2020-0007405 filed on Jan. 20, 2020 in the Korean Intellectual Property Office, the disclosure of which is incorporated by reference herein in its entirety.

TECHNICAL FIELD

The present invention relates to a display device, and more particularly, to an electronic panel capable of receiving external inputs and a display device including the same.

DISCUSSION OF THE RELATED ART

A variety of display devices used for multimedia apparatuses, such as televisions, mobile phones, tablet computers, navigation systems, and game consoles, have been under development. A typical display device may include an electronic panel, a polarizing layer, and a window. In addition, the electronic panel may display an image and detect external inputs, and the polarizing layer may be disposed on the display panel. Further, the electronic panel may generally include a display panel, that displays an image, and an input sensing layer that detects an external input.

SUMMARY

According to an embodiment of the present invention, an electronic panel includes: a plurality of sensing electrodes that overlap a sensing area; a line section that overlaps a peripheral area adjacent to the sensing area, wherein the line section includes a plurality of first lines and a plurality of second lines, wherein the plurality of first lines are respectively connected to first ends of the sensing electrodes, and the plurality of second lines are respectively connected to second ends of the sensing, electrodes; an insulation layer disposed between the first lines and the second lines, wherein the insulation layer defines a plurality of contact holes through which the first lines are electrically connected to corresponding second lines; and an electrostatic shield pattern disposed on the insulation layer on which the second lines are disposed, wherein the electrostatic shield pattern is electrically connected to one of the first lines through a guide contact hole defined in the insulation layer.

In an embodiment of the present invention, a first end of the electrostatic shield pattern is electrically connected to the one of the first lines, and a second end of the electrostatic shield pattern overlaps a different first line adjacent to the one of the first lines.

In an embodiment of the present invention, the electrostatic shield pattern includes a first electrostatic shield pattern and a second electrostatic shield pattern, wherein, at least one second line electrically connected to a first line is disposed between the first electrostatic shield pattern and the second electrostatic shield pattern.

In an embodiment of the present invention, the electrostatic shield pattern is disposed on the insulation layer, and the electrostatic shield pattern and the second lines are formed of a same material in a same process.

In an embodiment of the present invention, each of the second lines overlaps at least a portion of at least one of the first lines.

In an embodiment of the present invention, the electronic panel further includes a base layer that provides the sensing area and the peripheral area, wherein the sensing electrodes are disposed on the base layer, wherein the insulation layer includes: a first insulation part that overlaps the sensing area and covers the sensing electrodes; and a second insulation part that covers the first lines overlapping the second lines.

In an embodiment of the present invention, the first insulation part and the second insulation part are spaced apart from each other.

In an embodiment of the present invention, each of the second lines includes: a first line part disposed on the second insulation part; and a second line part disposed on a layer different from a layer on which the first line part is disposed.

In an embodiment of the present invention, each of the first lines includes: a first part that has a first planar area per unit length; and a second part that has a second planar area per unit length, wherein the second planar area is less than the first planar area.

In an embodiment of the present invention, the insulation layer overlaps the first part and does not overlap the second part.

In an embodiment of the present invention, the first part includes at least one opening that extends in a longitudinal direction of the first lines.

In an embodiment of the present invention, the sensing electrodes and the first lines are formed in the same process and are disposed on the base layer.

In an embodiment of the present invention, the sensing electrodes and the first lines include indium tin oxide (ITO), and the second lines and the electrostatic shield pattern include metal.

According to an embodiment of the present invention, a display device, includes: a display panel; and an input sensing layer disposed on the display panel, wherein the input sensing layer defines a sensing area and a peripheral area adjacent to the sensing area, wherein the input sensing layer includes: a first insulation layer disposed on the display panel; a plurality of sensing electrodes that overlap the sensing area and are disposed on the first insulation layer; a plurality of first lines that overlap the peripheral area and are disposed on the first insulation layer, wherein the first lines are respectively connected to first ends of the sensing electrodes; a second insulation layer that includes a first insulation part and a second insulation part, wherein the first insulation part overlaps the sensing area, and the second insulation part overlaps the peripheral area, wherein the second insulation part covers at least a portion of the first lines; a plurality of second lines including a first line part and a second line part, wherein the first line part is disposed on the second insulation part, and the second line part is disposed on the first insulation layer, wherein the plurality of first line parts are electrically connected to corresponding second lines through a plurality of contact holes defined in the second insulation part, and the plurality of second line parts are respectively connected to second ends of the sensing electrodes; and an electrostatic shield pattern disposed on the second insulation part and electrically connected to one of the first lines through a first guide contact hole defined in the second insulation part.

In an embodiment of the present invention, the electrostatic shield pattern includes a first electrostatic shield pattern and a second electrostatic shield pattern that are spaced apart from each other across the second line parts, wherein the second electrostatic shield pattern is closer than the first electrostatic shield pattern to the sensing area.

In an embodiment of the present invention, a second guide contact hole is formed in the second insulation part, wherein the first electrostatic shield pattern is electrically connected through the first guide contact hole to the one of the first lines, and wherein the second electrostatic shield pattern is electrically connected through the second guide contact hole to a different first line adjacent to the one of the first lanes.

In an embodiment of the present invention, a first end of the electrostatic shield pattern is connected through the first guide contact hole to the one of the first lines, and a second end of the electrostatic shield pattern overlaps a different first line adjacent to the one of the first lines.

In an embodiment of the present invention, the sensing electrodes and the first lines are formed in a same process and are disposed on the first insulation layer, and the electrostatic shield pattern and the second lines are formed in a same process and are disposed on the second insulation layer.

In an embodiment of the present invention, each of the first lines includes: a first part that has a first planar area per unit length; and a second part that has a second planar area per unit length, wherein the second planar area is less than the first planar area, wherein the plurality of second pans are respectively connected to the second ends of the sensing electrodes, and wherein the plurality of first parts overlap the second insulation part.

In an embodiment of the present invention, at least one of the second lines intersects at least one of the first lines.

DETAILED DESCRIPTION OF THE EMBODIMENTS

Figure 1A:
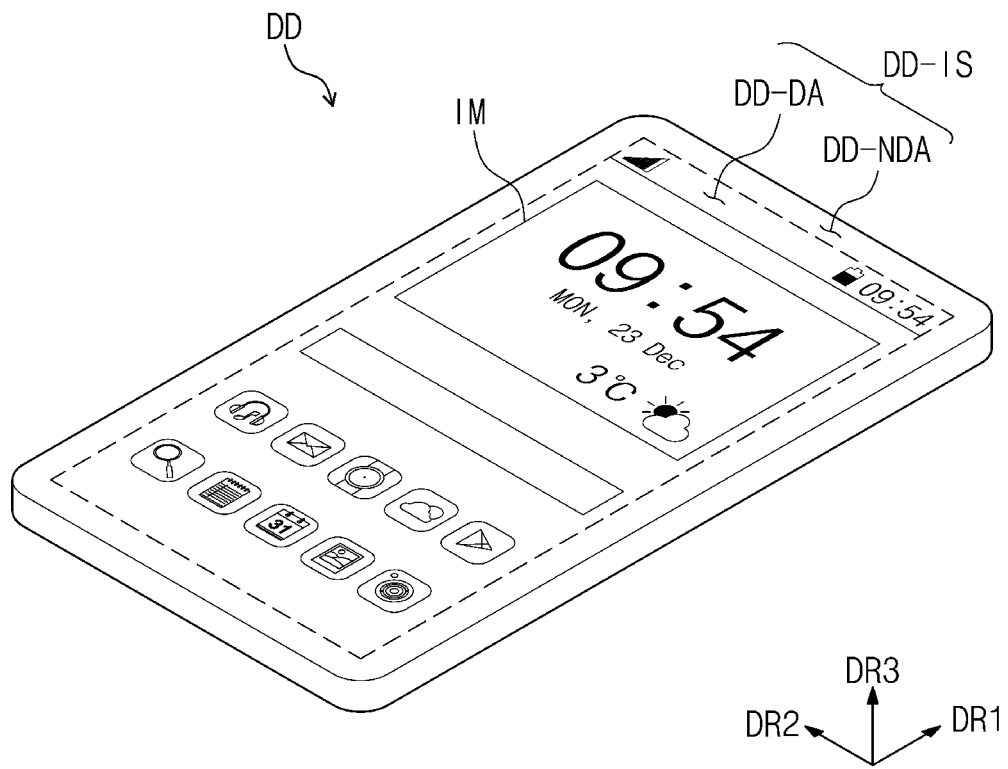
FIG. 1A illustrates a perspective view showing a display device according to an embodiment of the present invention.

In this description, it will be understood that when a certain component (or region, layer, portion, etc.) is referred to as being "on", "connected to", or "coupled to" other component(s), the certain component (or region, layer, portion, etc.) may be directly disposed on, directly connected to, or directly coupled to the other component(s) or at least one intervening component may be present therebetween.

It is to be understood that like numerals may indicate like components throughout the specification. Moreover, in the drawings, thicknesses, ratios, and dimensions of components may exaggerated for clarity.

The term "and/or" includes any and all combinations provided by related components.

It will be understood that, although the terms "first", "second", etc. may be used herein to describe various components, these components should not be limited by these terms. These terms are only used to distinguish one component from another component. For example, a first component could be termed a second component, and vice versa without departing from the spirit and scope of the present invention. Unless referred to the contrary, the singular forms are intended to include the plural forms as well.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

The following will now describe embodiments of the present invention with reference to the accompanying drawings.

Figure 1B:
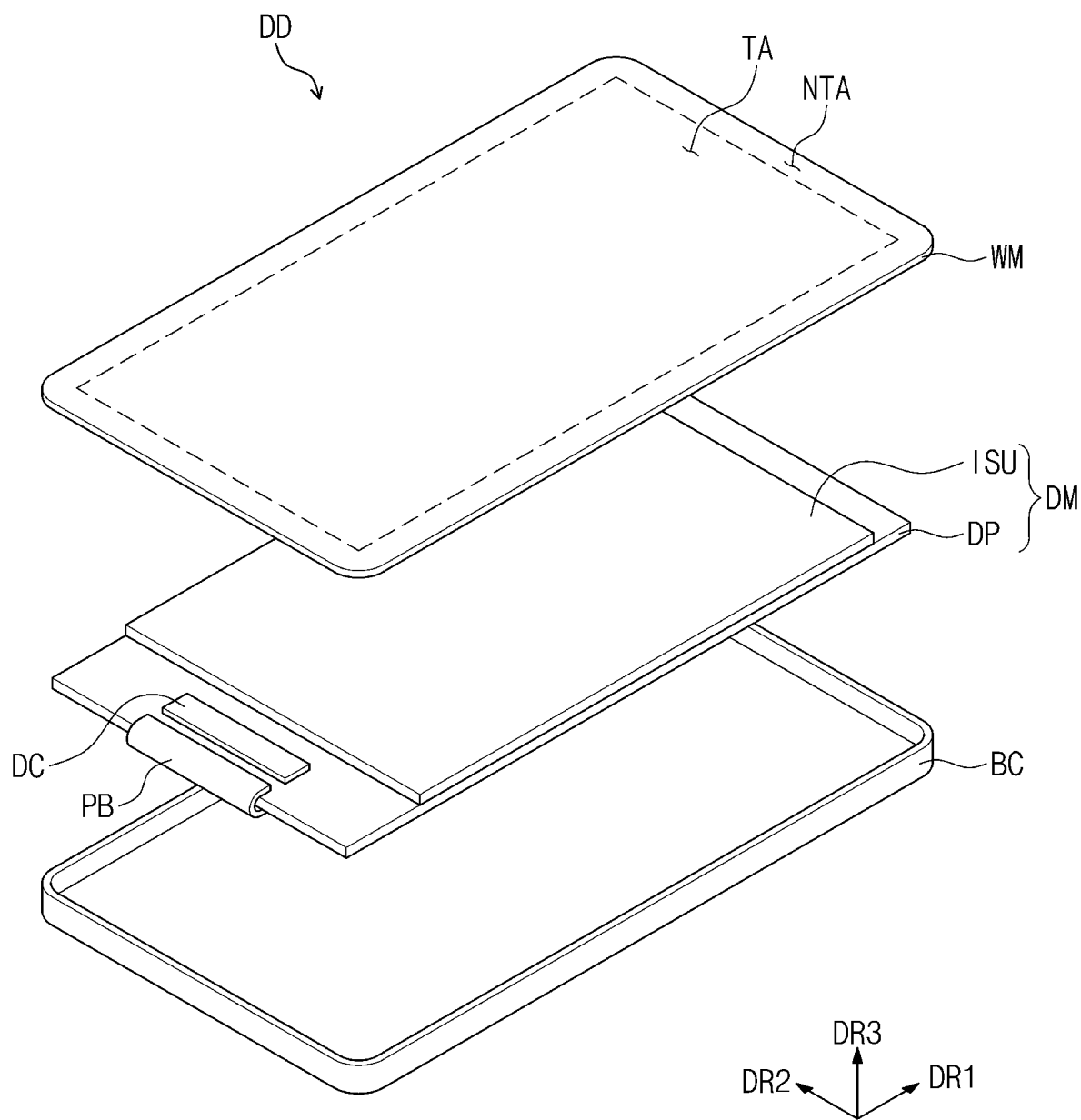
FIG. 1B illustrates an exploded perspective view showing a display device according to an embodiment of the present invention.
Figure 2:
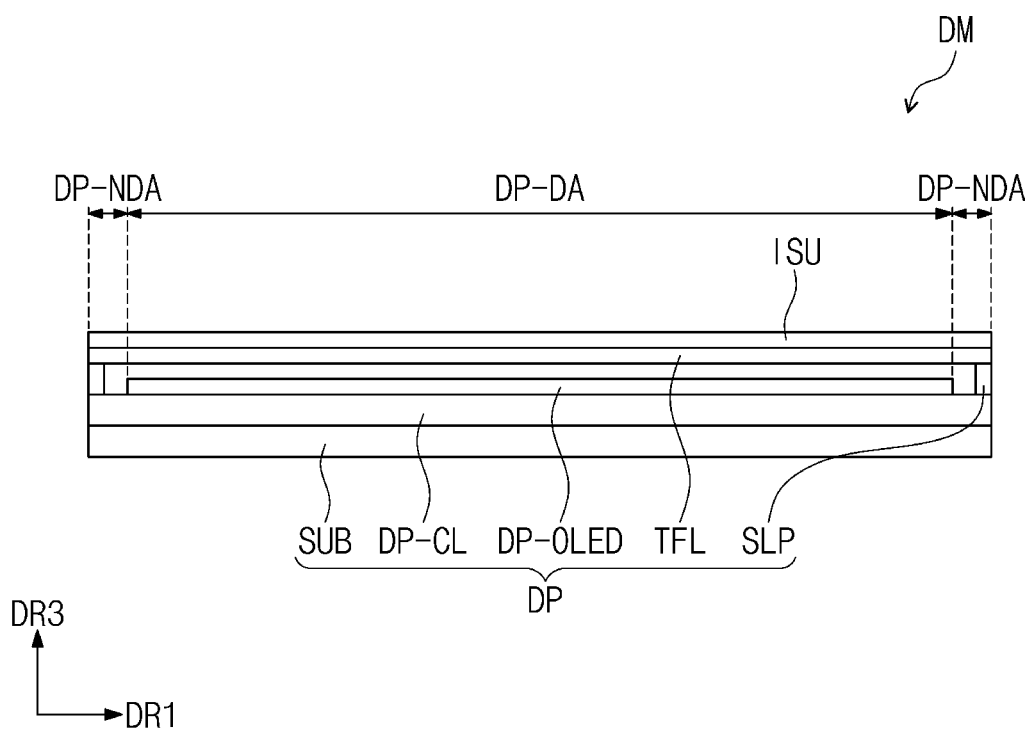
FIG. 2 illustrates a cross-sectional view showing an electronic panel according to an embodiment of the present invention.

FIG. 1A illustrates a perspective view showing a display device according to an embodiment of the present invention. FIG. 1B illustrates an exploded perspective view showing a display device according to an embodiment of the present invention. FIG. 2 illustrates a cross-sectional view showing an electronic panel according to an embodiment of the present invention.

In this description, a display device DD is illustrated as a mobile phone terminal, as an example. Although not shown, for example, the mobile phone terminal may be configured to include the display device DD in a bracket/casing which accommodates a mainboard on which are installed electronic modules, a camera module, a power module, and the like. The display device DD according to the present invention may be applicable not only to large-sized electronic products such as television sets and monitors, but to small and medium-sized electronic products such as tablet computers, automotive navigation systems, game consoles, and smart watches.

Referring to FIG. 1A, the display device DD may display an image IM on a display surface DD-IS. Icons are illustrated as an example of the image IM. The display surface DD-IS is parallel to a plane formed by a first direction DR1 and a second direction DR2. A third direction DR3 indicates a normal direction to the display surface DD-IS, or a thickness direction of the display device DD. In this description, the phrase "when viewed in plan" or "when viewed on a plane" may mean "when viewed in the third direction DR3". The third direction DR3 differentiates, from each other, a front surface (or top surface) and a rear surface (or bottom surface) of each layer or unit which will be discussed below. Directions indicated by the first, second, and third directions DR1, DR2, and DR3 are relative concepts and may denote respective opposite directions.

The display surface DD-IS includes a display area DD-DA on which the image IM is displayed and a non-display area DD-NDA adjacent to the display area DD-DA. The non-display area DD-NDA is a region on which no image is displayed. The present invention, however, is not limited thereto, and the non-display area DD-NDA may be adjacent to one side of the display area DD-DA, or may be omitted. For example, the non-display area DD-NDA may at least partially surround the display area DD-DA.

Referring to FIG. 1B, the display device DD may include a window WM, an electronic panel DM, a driver chip DC, a circuit board PB, and an accommodation member BC. The accommodation member BC may receive the electronic panel DM and may be combined with the window WM.

The window WM may be disposed on the electronic panel DM, and may externally transmit an image provided from the electronic panel DM. For example, the window WM may be disposed above the electronic panel DM, and may enable a user to view the image provided by the electronic panel DM. The window WM includes a transmission area TA and a non-transmission area NTA. The transmission area TA may overlap the display area DD-DA, and may have a shape that corresponds to that of the display area DD-DA. The image IM displayed on the display area DD-DA of the display device DD may be externally visible through the transmission area TA of the window WM.

The non-transmission area NTA may overlap the non-display area DD-NDA and may have a shape that corresponds to that of the non-display area DD-NDA. The non-transmission area NTA may be a region whose optical transmittance is relatively less than that of the transmission area TA. The present invention, however, is not limited thereto, and for example, the non-transmission area NTA may be omitted.

The window WM may include glass, sapphire, or plastic. Although the window WM is illustrated as a single layer, the window WM may include a plurality of layers. The window WM may include a base layer and at least one printed layer that overlaps the non-transmission area NTA and is disposed on a rear surface of the base layer. The printed layer may have a certain color. For example, the printed layer may have either a black color or any color other than the black color.

The electronic panel DM is disposed between the window WM and the accommodation member BC. The electronic panel DM includes a display panel DP and an input sensing layer ISU. The display panel DP may generate an image and may transfer the generated image to the window WM.

In an embodiment of the present invention, the display panel DP may be an emissive display panel. However, the present invention is not limited thereto. For example, the display panel DP may be an organic light emitting display panel or a quantum-dot light emitting display panel. An emission layer of an organic light emitting display panel may include an organic light emitting material. An emission layer of the quantum-dot light emitting display panel may include a quantum-dot or a quantum-rod. The following will discuss an example in which an organic light emitting display panel is adopted as the display panel DP.

It is explained below that an organic light emitting display panel is used as the display panel DP according to an embodiment of the present invention. The present invention, however, is not limited thereto. For example, various types of display panels are applicable to the present invention.

Referring to FIG. 2, the display, panel DP includes a base substrate SUB and also includes a circuit element layer DP-CL, a display element layer DP-OLED, an insulation layer TFL, and a connecting, member SLP, all of which are disposed on the base substrate SUB. The connecting member SLP may also be referred to as a coupling member, connector, connecting unit, seal, or sealant.

The display panel DP includes a display area DP-DA and a non-display area DP-NDA. The display area DP-DA of the display panel DP corresponds to the display area DD-DA illustrated in FIG. 1A and/or to the transmission area TA illustrated in FIG. 1B, and the non-display area DP-NDA of the display panel DP corresponds to the non-display area DD-NDA illustrated in FIG. 1A and/or to the non-transmission area NTA illustrated in FIG. 1B.

For example, the base substrate SUB may include at least one plastic film. The base substrate BS may include a flexible substrate, for example, a plastic substrate, a glass substrate, a metal substrate, or an organic/inorganic composite material substrate.

For example, the circuit element layer DP-CL includes at least one intermediate insulation layer and at least one circuit element. For example, the intermediate insulation layer includes at least one intermediate inorganic layer and at least one intermediate organic layer. The circuit element includes signal lines and a pixel driver circuit.

The display element layer DP-OLED includes a plurality of organic light emitting diodes. The display element layer DP-OLED may further include an organic layer such as a pixel definition layer. In an embodiment of the present invention, when the display panel DP is provided in the type of a liquid crystal display panel, the display element layer DP-OLED may be provided in the type of a liquid crystal layer.

For example, the insulation layer TFL may encapsulate the display element layer DP-OLED. For example, the insulation layer. TFL may be a thin-film encapsulation layer. The insulation layer TFL may protect the display element layer DP-OLED against foreign substances such as moisture, oxygen, and dust particles. The present invention, however, is not limited thereto, and for example, the insulation layer TFL may be replaced with an encapsulation substrate. In this case, the encapsulation substrate may stand opposite to the base substrate SUB, and the circuit element layer DP-CL and the display element layer DP-OLED may be disposed between the encapsulation substrate and the base substrate SUB.

The input sensing layer ISU may be disposed between the window WM and the display panel DP. The input sensing layer ISU may detect an externally applied input. The externally applied input may be provided in various types. For example, the externally applied input includes a user's body, a stylus pen, light, heat, pressure, or any various types of external input. In addition, the externally applied input may not only include a user's touch, but may also include an approaching spatial touch (e.g., a hovering touch).

The input sensing layer ISU may be disposed on the display panel DP. For example, the input sensing layer ISU may be directly disposed on the display panel DP. In this description, the phrase "A is directly disposed on B" means that no adhesive layer is disposed between A and B. In the present embodiment, the input sensing layer ISU and the display panel DP may be fabricated in a successive process. The present invention, however, is not limited thereto. The input sensing layer ISU may be provided as an individual panel, and may be coupled through an adhesive layer to the display panel DP.

The connecting member SLP may be disposed between the base substrate SUB and the insulation layer TFL. The connecting member SLP may be coupled to, or connected to, the base substrate SUB and the insulation layer TFL.

The connecting, member SLP may be any type of connector that couples the base substrate SUB and the insulation layer TFL together. For example, the connector may take the form of the connecting member SLP material such as an organic material such as a photo-plastic resin, or an inorganic material such as a frit seal, but is not limited to any one particular embodiment.

Referring back to FIG. 1B, the driver chip DC may be disposed on the display panel DP, while overlapping the non-display area DP-NDA. For example, in response to control signals transferred from the circuit board PB, the driver chip DC may generate drive signals for operation of the display panel DP. The driver chip DC may transfer the generated drive signals to the circuit element layer DP-CL of the display panel DP. In this description, the driver chip DC may be explained as an electronic component.

The circuit board PB may be disposed at an end of the base substrate SUB and electrically connected to the circuit element layer DP-CLP. For example, the circuit board PB may be disposed on a portion of the display panel DP not overlapping the input sensing layer ISU. The circuit board PB may be rigid or flexible. For example, when, the circuit board PB is flexible, the circuit board PB may be provided as a flexible printed circuit board. For example, the circuit board PB may include a timing control circuit that controls operation of the display panel DP. The timing control circuit may be provided in the shape of an integrated circuit chip mounted on the circuit board PB. In addition, although not shown, the circuit board PB may include an input sensing circuit that controls the input sensing layer ISU.

Figure 3:
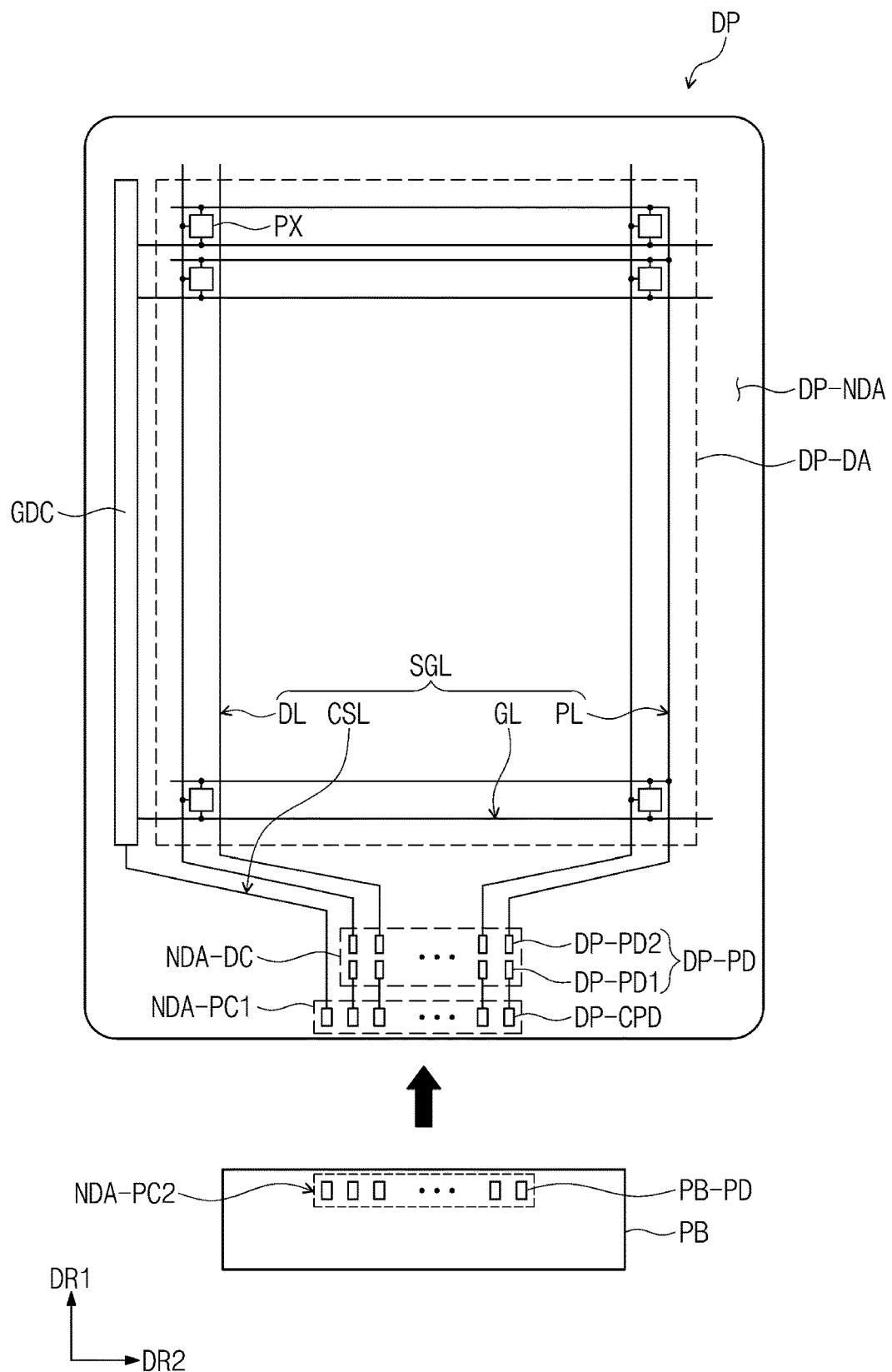
FIG. 3 illustrates a plan view showing a display panel according to an embodiment of the present invention.

FIG. 3 illustrates a plan view showing a display panel according to an embodiment of the present invention.

Referring to FIG. 3, the display panel DP may include a driver circuit GDC, a plurality of signal lines SGL, a plurality of signal pads DP-PD, a plurality of connection pads DP-CPD, and a plurality of pixels PX. The pixels PX are disposed on the display area DP-DA. Each of the pixels PX includes an organic light emitting diode and a pixel driver circuit connected to the organic light emitting diode. The driver circuit GDC, the signal lines SGL, the signal pads DP-PD, the connection pads DP-CPD, and the pixel driver circuit may be included in the display circuit layer DP-CL illustrated in FIG. 2.

In this description, the display panel DP may be explained as a display substrate, and the display substrate may include the base substrate SUB on which the plurality of signal pads DP-PD and the plurality of connection pads DP-CPD are disposed.

The driver circuit GDC sequentially outputs gate signals to a plurality of gate lines GL. The driver circuit GDC may further output different control signals to the pixels PX. The driver circuit GDC may include a plurality of thin film transistors formed by, for example, one of a low temperature polycrystalline silicon (LTPS) process or a low temperature polycrystalline oxide (LTPO) process that are the same as a process used to form driver circuits for the pixels PX.

The signal lines SGL include gate lines GL, data lines DL a power line PL, and a control signal line CSL. Each of the gate lines GL is connected to a corresponding pixel PX, and each of the data lines DL is connected to a corresponding pixel PX. The power line PL is connected to the pixels PX. The control signal line CSL may provide a scan driver circuit with control signals.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to a distal end of the line part. The pad part may be disposed on the non-display area DP-NDA and may overlap a corresponding signal pad DP-PD.

The non-display area DP-NDA may have a chip area NDA-DC in which the signal pads DP-PD are disposed, and the non-display area DP-NDA may also have a first pad area NDA-PC1 in which the connection pads DP-CPD are disposed.

In an embodiment of the present invention, the driver chip DC illustrated in FIG. 1B may be mounted on the chip area NDA-DC. The signal pads DP-PD are electrically connected to the driver chip DC, and provide the signal lines SGL with electrical signals received from the driver chip DC.

For example, the signal pads DP-PD include first row signal pads DP-PD1 arranged along the first direction DR1 on a first row, and also include second row signal pads DP-PD2 arranged along the first direction DR1 on a second row. The present invention, however, is not limited thereto, and for example, the signal pads DP-PD may be arranged along the first direction DR1 on a single row.

A portion of the circuit board PB may be disposed on the first pad area NDA-PC1. The connection pads DP-CPD are electrically connected to the circuit board PB and provide the signal pads DP-PD with electrical signals received from the circuit board PB. The circuit board PB may be rigid or flexible. For example, when the circuit board PB is flexible, the circuit board PB may be provided as a flexible printed circuit board.

For example, the circuit board PB may include a timing control circuit that controls operation of the display panel DP. The timing control circuit may be an integrated circuit chip mounted on the circuit board PB. In addition, although not shown, the circuit board PB may include an input sensing circuit that controls the input sensing layer ISU.

The circuit board PB may include drive pads PB-PD electrically connected to the display panel DP. The drive pads PB-PD may be disposed on a second pad area NDA-PC2 provided on the circuit board PB.

Figure 4:
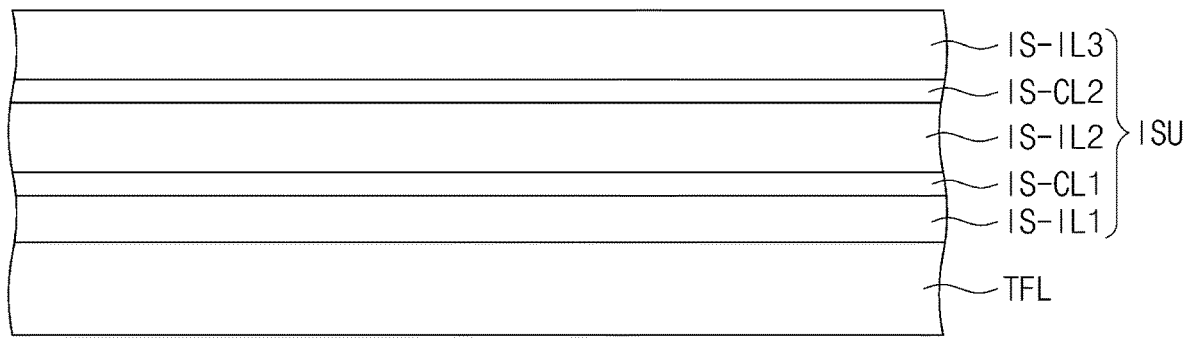
FIG. 4 illustrates a cross-sectional view showing an input sensing layer according to an embodiment of the present invention.

FIG. 4 illustrates a cross-sectional view showing an input sensing layer according to an embodiment of the present invention.

Referring to FIG. 4, the input sensing layer ISU may include a first sensing insulation layer IS-IL1, a first conductive layer IS-CL1, a second sensing insulation layer IS-IL2, a second conductive layer IS-CL2, and a third sensing insulation layer IS-IL3. The first sensing insulation layer IS-IL1 may be disposed on the insulation layer TFL. For example, the first sensing insulation layer IS-IL1 may be directly disposed on the insulation layer TFL. The present invention, however, is not limited thereto. The first sensing insulation layer IS-IL1 may be omitted, and in this case, the first conductive layer IS-CL1 may be disposed on the insulation layer TFL.

Each of the first and second conductive layers IS-CL1 and IS-CL2 may have either a single-layered structure or a multi-layered structure in which a plurality of layers are stacked along the third direction DR3. The multi-layer structured conductive layer may include at least two layers of transparent conductive layers and/or metal layers. For example, the multi-layer structured conductive layer may include metal layers including different metals.

The transparent conductive layer may include indium tin oxide (ITO), indium zinc oxide (IZO), zinc oxide (ZnO), indium tin zinc oxide (ITZO), PEDOT, metal nano-wires, or graphene. The metal layer may include silver, titanium, copper, aluminum, or any alloy thereof. For example, each of the first and second conductive layers IS-CL1 and IS-CL2 may have a tri-layered structure or a three-metal-layer stack of titanium/aluminum/titanium. The tri-layered structure may be configured such that an outer layer includes metal with high durability and low reflectance, and that an inner layer includes metal with high electrical conductivity.

For example, each of the first, second, and third sensing insulation layers IS-IL1, IS-IL2, and IS-IL3 may include an inorganic layer or an organic layer. In the present embodiment, the first sensing insulation layer IS-IL1 may include an inorganic layer. The present invention, however, is not limited thereto. For example, the first and second sensing insulation layers IS-IL1 and IS-IL2 may include an inorganic layer, and the third sensing insulation layer IS-IL3 may include an organic layer.

Figure 5:
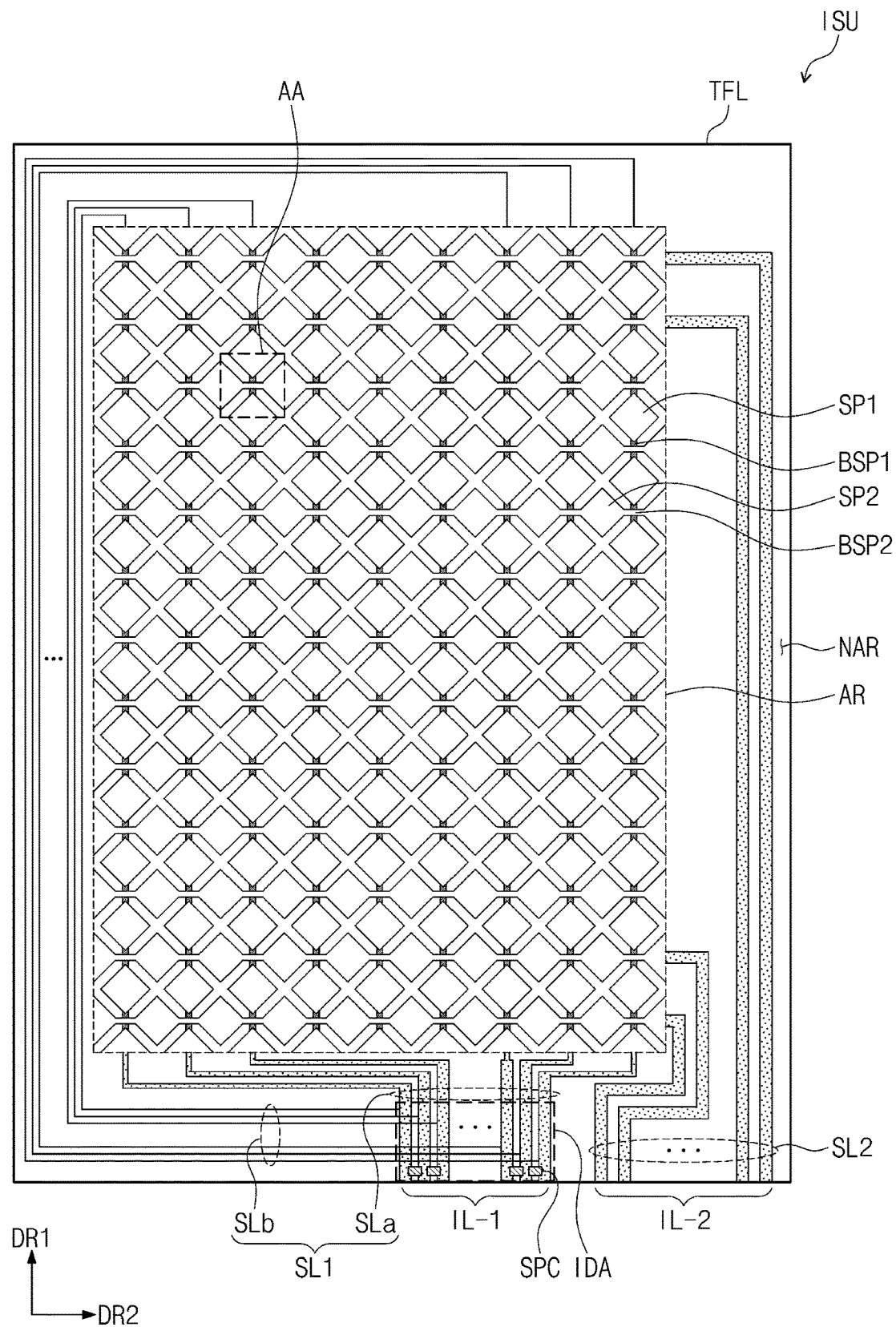
FIG. 5 illustrates a plan view showing an input sensing layer according to an embodiment of the present invention.
Figure 6:
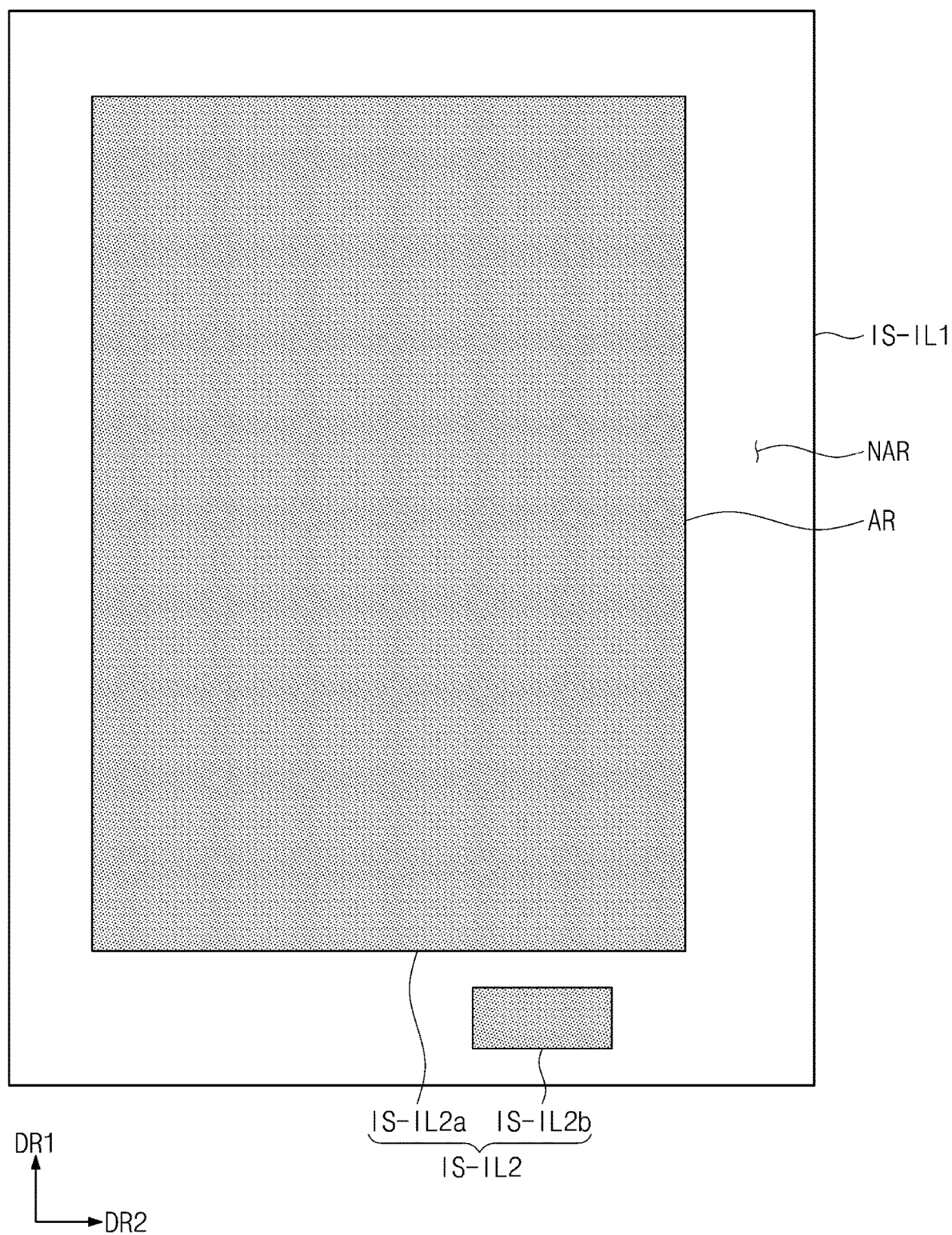
FIG. 6 illustrates a plan view showing a sensing insulation layer included in an input sensing layer according to an embodiment of the present invention.

FIG. 5 illustrates a plan view showing an input sensing layer according to an embodiment of the present invention. FIG. 6 illustrates a plan view showing a sensing insulation layer included in an input sensing layer according to an embodiment of the present invention.

Referring to FIG. 5, the input sensing layer ISU includes a sensing area AR and a peripheral area NAR adjacent to the sensing area AR. The peripheral area NAR may also be called a non-sensing area below. The sensing area AR of the input sensing layer ISU may overlap the display area DP-DA of the display panel DP discussed above. The non-display area DP-NDA of the display panel DP may overlap the non-sensing area NAR of the input sensing layer ISU. The non-sensing area NAR may be adjacent to one side of the sensing area AR or may be omitted. According to the present invention, the sensing area AR may be a region that detects an externally applied input.

For example, the input sensing layer ISU includes first sensing electrodes, second sensing electrodes, first connection patterns BSP1, second connection patterns BSP2, a first line section IL-1, and a second line section IL-2. The first sensing electrodes, the second sensing electrodes, the first connection patterns BSP1, and the second connection patterns BSP2 overlap the sensing area AR, and the first line section IL-1 and the second line section IL-2 overlap the non-sensing area NAR.

The first sensing electrodes may extend in the first direction DR1 and may be arranged in the second direction DR2. The number of the first sensing electrodes is n (where, n is a natural number). Each of the first sensing electrodes includes a plurality of first sensing patterns SP1, which are spaced apart from each other from a plan view and are arranged in the first direction DR1. For example, the first sensing electrodes may include indium tin oxide (ITO).

The second sensing electrodes may extend in the second direction DR2 and may be arranged in the first direction DR1. The number of the second sensing electrodes is m (where, m is a natural number). For example, the second sensing electrodes may include indium tin oxide (ITO). Each of the second sensing electrodes includes a plurality of second sensing patterns SP2, which are spaced apart from each other, from a plan view, and are arranged in the second direction DR2. From a plan view, the second sensing patterns SP2 may be spaced apart and insulated from the first sensing patterns SP1.

The first connection patterns BSP1 may connect the first sensing patterns SP1 to each other. For example, a single first connection pattern BSP1 may electrically connect two first sensing patterns SP1 that neighbor each other in the first direction DR1.

The second connection patterns BSP2 may connect the second sensing patterns SP2 to each other. For example, a single second connection pattern BSP2 may electrically connect two second sensing patterns SP2 that neighbor each other in the second direction DR2. The first connection pattern BSP1 and the second connection pattern BSP2 may intersect each other, from a plan view, and may be insulated from each other when viewed in cross-section.

According to the present embodiment, the first sensing patterns SP1, the second sensing patterns SP2, and the second connection patterns BSP2 may be formed of the same material in the same process, and may be included in the first conductive layer IS-CL1 discussed above in FIG. 4. The first sensing patterns SP1, the second Sensing patterns SP2, and the second connection patterns BSP2 may be formed on the same layer as each other. For example, the first sensing patterns SP1, the second sensing patterns SP2, and the second connection patterns BSP2 may be directly disposed on the first sensing insulation layer IS-IL1.

The first sensing patterns SP1 the second sensing patterns SP2, and the second connection patterns BSP2 may include, for example, transparent conductive oxide. For example, the transparent conductive oxide may include one or more of indium zinc oxide (IZO), indium tin oxide (ITO), indium gallium oxide (IGO), indium zinc gallium oxide (IGZO), and any mixture or compound thereof.

According to the present embodiment, the first connection patterns BSP1 may be included in the second conductive layer IS-CL2 discussed above in FIG. 4. The first connection patterns BSP1 may be disposed on the second sensing insulation layer IS-IL2 that covers the first conductive layer IS-CL1. For example, the first connection patterns BSP1 may be directly disposed on the second sensing insulation layer IS-IL2. The first connection patterns BSP1 may be electrically connected to the first sensing patterns SP1 through contact holes formed in the second sensing insulation layer IS-IL2.

The first connection patterns BSP1 may include a material different from that of components included in the first conductive layer IS-CL1. For example, the first connection patterns BSP1 may include a metallic material. The metallic material may include, for example, molybdenum, silver, titanium, copper, aluminum, or any alloy thereof.

The first line section IL-1 may be electrically connected to the First sensing electrodes. The first line section IL-1 includes a plurality of first sensing lines SL1. The first sensing lines SL1 include first lines Sla and second lines SLb. The first lines Sla are respectively connected to ends of the first sensing electrodes, and the second lines SLb are respectively connected to other ends of the first sensing electrodes. For example, the first tines SLa may include ITO.

The first lines SLa may have, first ends respectively connected to the ends of the first sensing electrodes, and may also have second ends that externally receive electrical signals to drive the input sensing layer ISU. Accordingly, the first lines SLa may transfer electrical signals to the input sensing layer ISU. The second lines SLb may have first ends electrically connected to corresponding first lines SLa, and may also have second ends that are respectively connected to the other ends of the first sensing electrodes.

In an embodiment of the present invention, each of the second lines SLb may partially overlap at least one of the first lines SLa. For example, from a plan view, one of the second lines SLb may intersect at least one of the first lines SLa. To prevent an electrical short between the first and second lines SLa and SLb that intersect each other from a plan view, an insulation layer may be disposed between the first and second lines SLa and SLb that overlap each other.

For example, referring to FIG. 6, the second sensing insulation layer IS-IL2 includes a first insulation part IS-IL2a and a second insulation part IS-IL2b. The first insulation part IS-IL2a overlaps the sensing area AR, and the second insulation part IS-IL2b overlaps the non-sensing area NAR. From a plan view, the second insulation part IS-IL2b may have an area less than that of the first insulation part IS-IL2a and may be spaced apart from the first insulation part IS-IL2a.

The first insulation part IS-IL2a may cover components included in the first conductive layer IS-CL1 and may be disposed on the first sensing insulation layer IS-IL1 For example, the first insulation part IS-IL2a may entirely cover components included in the first conductive layer IS-CL1. The first insulation part IS-IL2a may include a plurality of contact holes through which the first sensing electrodes are electrically connected to the first connection patterns BSP1.

The second insulation part IS-IL2b may be disposed between the first lines SLa and the second lines SLb that intersect each other from a plan view. The second insulation part IS-IL2b may include a plurality of contact holes through which the ends of the second lines SLb are electrically connected to corresponding first lines SLa.

Referring back to FIG. 5, the second line section IL-2 may include a plurality of second sensing lines SL2 that may be electrically connected to the second sensing electrodes. According to the present embodiment, the second sensing lines SL2 in the second line section IL-2 may not overlap the second sensing insulation layer IS-IL2 illustrated in FIG. 6. The second sensing lines SL2 may have first ends connected to corresponding second sensing electrodes, and may also have second ends that externally receive electrical signals for driving the input sensing layer ISU. Accordingly, the second sensing lines SL2 may transfer electrical signals to the input sensing layer ISU. The second ends of the second sensing lines SL2 may be aligned with the second ends of the first lines Sla of the first sensing lines SL1.

In an embodiment of the present invention, the first lines SLa and the second sensing lines SL2 may be disposed on the first sensing insulation layer IS-IL1 shown in FIG. 4, and may be included in the first conductive layer IS-CL1. For example, the first lines SLa and the second sensing lines SL2 may be formed, on the first sensing insulation layer IS-IL1, in the same process used to form the first sensing electrodes and the second sensing electrodes.

Each of the second lines SLb of the first sensing lines SL1 includes one part disposed on the second insulation part IS-IL2b, and also includes another part whose longitudinal length is greater than that of the one part and which is disposed on the first sensing insulation layer IS-IL1. The one part of each of the second lines SLb may be connected to a corresponding first line SLa through the contact hole formed in the second insulation part IS-IL2b. A detailed structure of the first sensing line SLa will be further discussed below with reference to FIG. 9.

As discussed above, the second ends of the first lines SLa may externally receive electrical signals for driving the input sensing layer ISU. In addition, foreign factors or the like may compel external electrostatic charges to enter the second ends of the first lines SLa. In this case, the external electrostatic charges that enter the second ends of the first lines SLa may be transferred to the second lines SLb through the contact holes formed in the second insulation part IS-IL2b. As a result, the external electrostatic charges may damage a partial section of the second lines SLb, and thus no electrical signal may be provided to a corresponding other end of the first sensing electrode.

In an embodiment of the present invention, the electronic panel DM may include an electrostatic shield pattern SPC disposed on the second insulation part IS-IL2b on which the second lines SLb are disposed. The electrostatic shield pattern SPC may be spaced apart from the second lines SLb, and may be closer to the second ends of the first lines SLa than the second lines SLb. For example, the electrostatic shield pattern SPC and the second lines SLb may be formed of the same material and in the same process. For example, the second lines SLb and the electrostatic shield pattern SPC include metal.

For example, the electrostatic shield pattern SPC may include an end that is electrically connected to a corresponding first line of the first lines SLa through a guide contact hole formed in the second insulation part IS-IL2b, and may also include another end that is insulated from the first lines SLa. The first line of the first lines SLa may be connected to one of the second lines SLb.

According to the discussed above, external electrostatic charges transferred to another end of the first line of the first lines SLa may be transmitted through the guide contact hole to the end of the electrostatic shield pattern SPC before the external electrostatic charges are provided to the second line SLb. The external electrostatic charges transmitted to the end of the electrostatic shield pattern SPC may travel toward the other end of the electrostatic shield pattern SPC. The other end of the electrostatic shield pattern SPC may have a structure that is disposed on the second insulation part IS-IL2b and is spaced apart from the second lines SLb. As a result, the second lines SLb may be prevented from being provided with the external electrostatic charges transmitted to the electrostatic shield pattern SPC.

Figure 7:
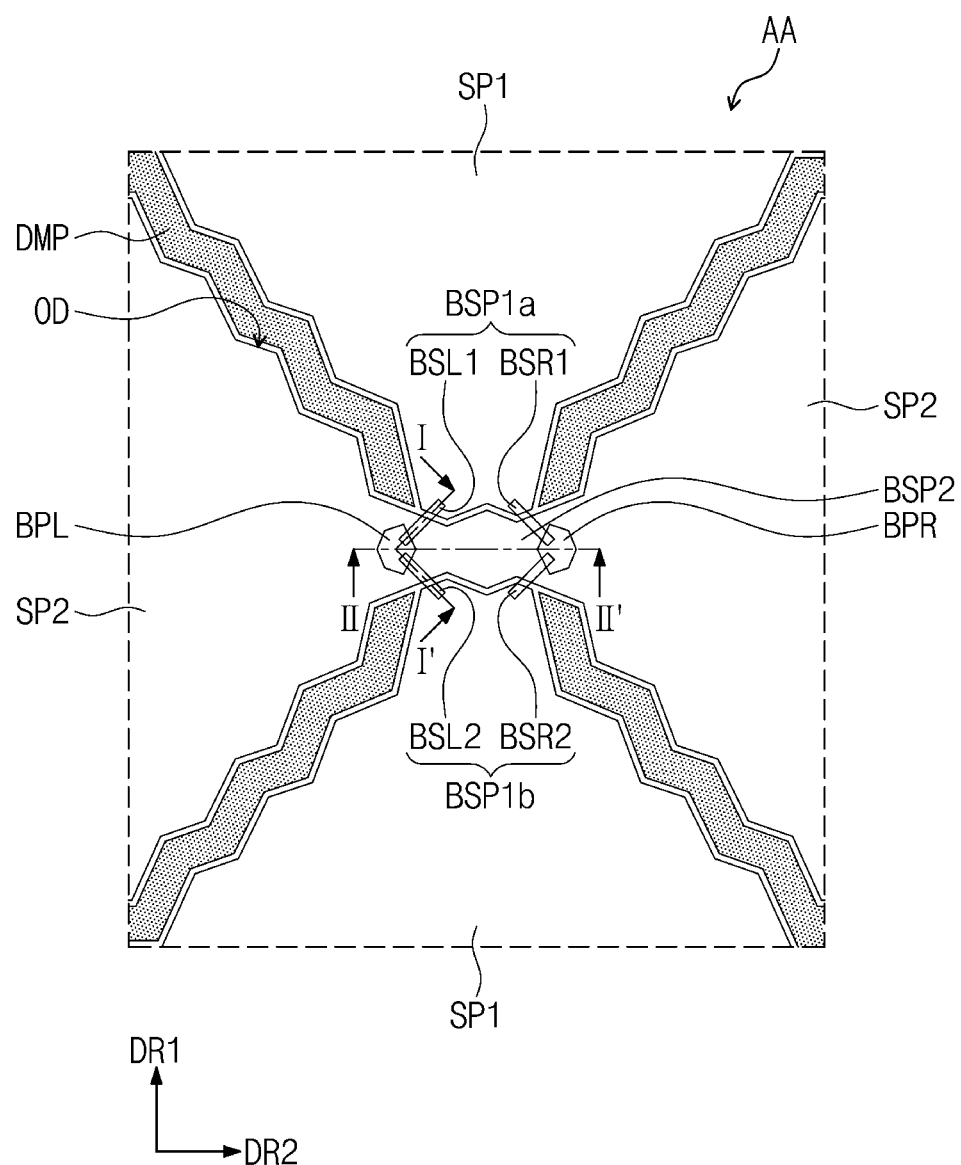
FIG. 7 illustrates an enlarged view showing section AA of FIG. 5.
Figure 8A:
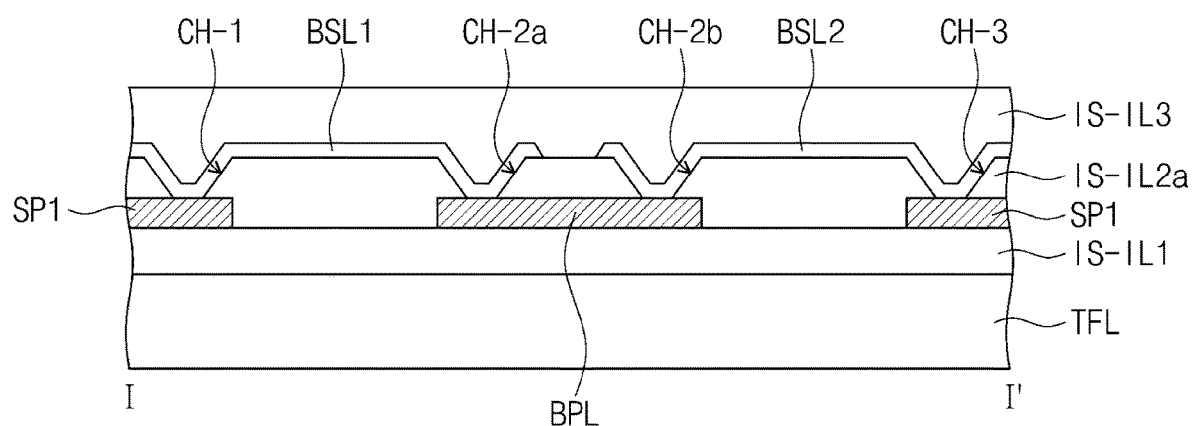
FIG. 8A illustrates a cross-sectional view taken along line I-I' of FIG. 7.
Figure 8B:
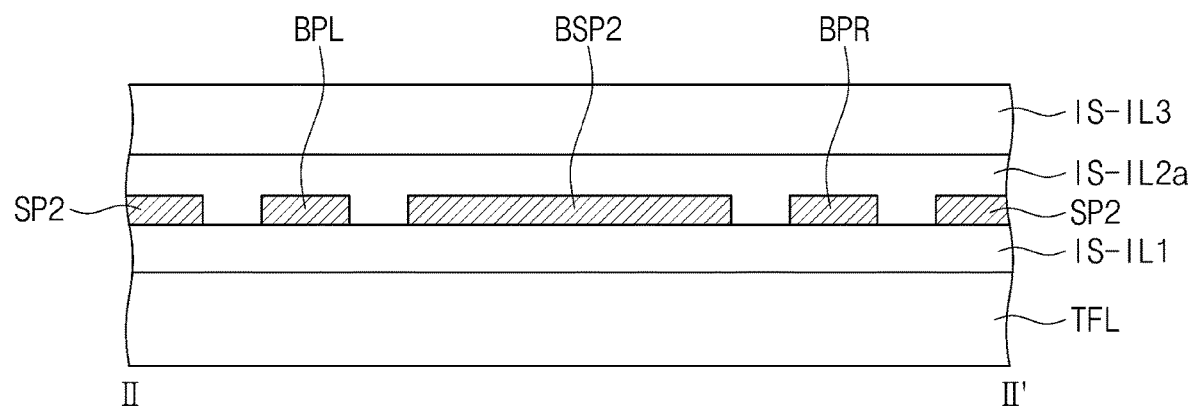
FIG. 8B illustrates a cross-sectional view taken along line II-II' of FIG. 7.

FIG. 7 illustrates an enlarged vie showing section AA of FIG. 5. FIG. 8A illustrates a cross-sectional view taken along line I-I' of FIG. 7. FIG. 8B illustrates a cross-sectional view taken along line II-II' of FIG. 7.

Referring to FIG. 7 according to an embodiment of the present invention, two first sensing patterns SP1, two second sensing patterns SP2, the first connection pattern BSP1 the second connection pattern BSP2, and auxiliary patterns BPL and BPR are illustrated. The two first sensing patterns SP1 face each other in the first direction DR1, and the second sensing patterns SP2 face each other in the second direction DR2.

The auxiliary patterns BPL and BPR may be disposed between the two first sensing patterns SP1, and from a plan view, may be spaced apart from the first sensing patterns SP1. The auxiliary patterns BPL and BPR include a first auxiliary pattern BPL and a second auxiliary pattern BPR that are spaced apart from each other.

According to the present embodiment, the auxiliary patterns BPL and BPR may be formed on the same layer as the first sensing patterns SP1 and the second sensing patterns SP2. For example, the same process and material may be employed to form the auxiliary patterns BPL and BPR disposed on the first se ns insulation layer IS-IL1.

The first connection pattern BSP1 may use the auxiliary patterns BPL and BPR to electrically connect the two first sensing patterns SP1, that are spaced apart from each other, to each other. The first connection pattern BSP1 includes a first branch BSP1a and a second branch BSP1b, each of which overlaps at least a portion of the second connection pattern BSP2.

The first branch BSP1a includes a first sub-branch BSL1 and a second sub-branch BSR1 that are spaced apart from each other. The first sub-branch BSL1 includes an end that is electrically connected to an upper first sensing pattern SP1 through the contact hole formed in the second sensing insulation layer (see IS-IL2 of FIG. 4), and the first sub-branch BSL1 also includes another end that is electrically connected to the first auxiliary pattern BPL through the contact hole formed in the second sensing insulation layer IS-IL2. The second sub-branch BSR1 includes an end that is electrically connected to the upper first sensing pattern SP1 through the contact hole formed in the second sensing insulation layer IS-IL2, and the second sub-branch BSR1 also includes another end that is electrically connected to the second auxiliary pattern BPR through the contact hole formed in the second sensing insulation layer IS-IL2.

The second branch BSP1b includes a third sub-branch BSL2 and a fourth sub-branch BSR2 that are spaced apart from each other. The third sub-branch BSL2 includes an end that is electrically connected to a lower first sensing pattern SP1 through the contact hole formed in the second sensing insulation layer IS-IL2, and third sub-branch BSL2 also includes another end that is electrically connected to the first auxiliary pattern BPL through the contact hole formed in the second sensing insulation layer IS-IL2. The fourth sub-branch BSR2 includes an end that is electrically connected to the lower first sensing pattern SP1 through the contact hole formed in the second sensing insulation layer IS-IL2, and the fourth sub-branch BSR2 also includes another end that is electrically connected to the second auxiliary pattern BPR through the contact hole formed in the second sensing insulation layer IS-IL2.

According to the discussed above, the first sub-branch BSL1 electrically connects the first auxiliary pattern BPL and the upper first sensing pattern SP1 to each other, and the third sub-branch BSL2 electrically connects the first auxiliary pattern BPL and the lower first sensing pattern SP1, to each other. As a result, the upper first sensing pattern SP1 may be electrically connected to the lower first sensing pattern SP1. Likewise, the second sub-branch BSR1 electrically connects the second auxiliary pattern BPR and the upper first sensing pattern SP1 to each other, and the fourth sub-branch BSR2 electrically connects the second auxiliary pattern BPR and the lower first sensing pattern SP1 to each other.

In an embodiment of the present invention, from a plan view, dummy patterns DMP may be disposed between the first sensing patterns SP1 and the second sensing patterns SP2. The dummy patterns DMP may be disposed at boundaries between the first sensing patterns SP1 and the second sensing patterns SP2. The dummy patterns DMP may have their interval spaces OD at the boundaries between the first sensing patterns SP1 and the second sensing patterns SP2. For example, the dummy patterns DMP may be floating patterns spaced apart from the first sensing patterns SP1 and the second sensing patterns SP2. The dummy patterns DMP may prevent visible recognition of gaps between the first sensing patterns SP1 and the second sensing patterns SP2.

FIG. 7 shows that the first sensing patterns SP1, the second sensing patterns SP2, and the dummy patterns DMP are each provided with side surfaces that are uneven. For example, the first sensing patterns SP1, the second sensing patterns SP2, and the dummy patterns DMP may each have sides that have protrusions and indentions or sides that are jagged. As an additional example, the first sensing patterns SP1, the second sensing patterns SP2, and the dummy patterns DMP may each be provided in the shape of a staircase, but the patterns SP1, SP2, and DMP may each be shaped like a straight line or may each include a groove. The staircase-shaped dummy patterns DMP may increase a sensing area for detecting external inputs within the same area. Accordingly, it may be possible to provide an input sensing unit with increased touch sensitivity.

Referring to FIG. 8A, a structure is illustrated in which the two first sensing patterns SP1 spaced apart from each other are electrically connected to each other through the first sub-branch BSL1 and the third sub-branch BSL2.

A first contact hole CH-1, second contact holes CH-2a and CH-2b, and a third contact hole CH-3 are formed in the second sensing insulation layer IS-IL2. The first contact hole CH-1 and the third contact hole CH-3 externally expose the first sensing patterns SP1, and the second contact holes CH-2a and CH-2b externally expose the first auxiliary pattern BPL.

The first sub-branch BSL1 may be electrically connected through the first contact bole CH-1 to the upper first sensing pattern SP1. The third sub-branch BSL2 may be electrically connected through the third contact hole CH-3 to the lower first sensing pattern SP1.

The first auxiliary pattern BPL may be disposed on the first sensing insulation layer IS-IL1 on which the first sensing patterns SP1 are disposed. The first auxiliary pattern BPL may be electrically connected through the second contact holes CH-2a and CH-2b to the first sub-branch BSL1 and the third sub-branch BSL2.

Referring to FIG. 8B, the first auxiliary pattern BPL and the second auxiliary pattern BPR may be spaced apart from the second sensing patterns SP2. For example, the first auxiliary pattern BPL and the second auxiliary pattern BPR may each have a structure insulated from the second sensing patterns SP2.

Figure 9:
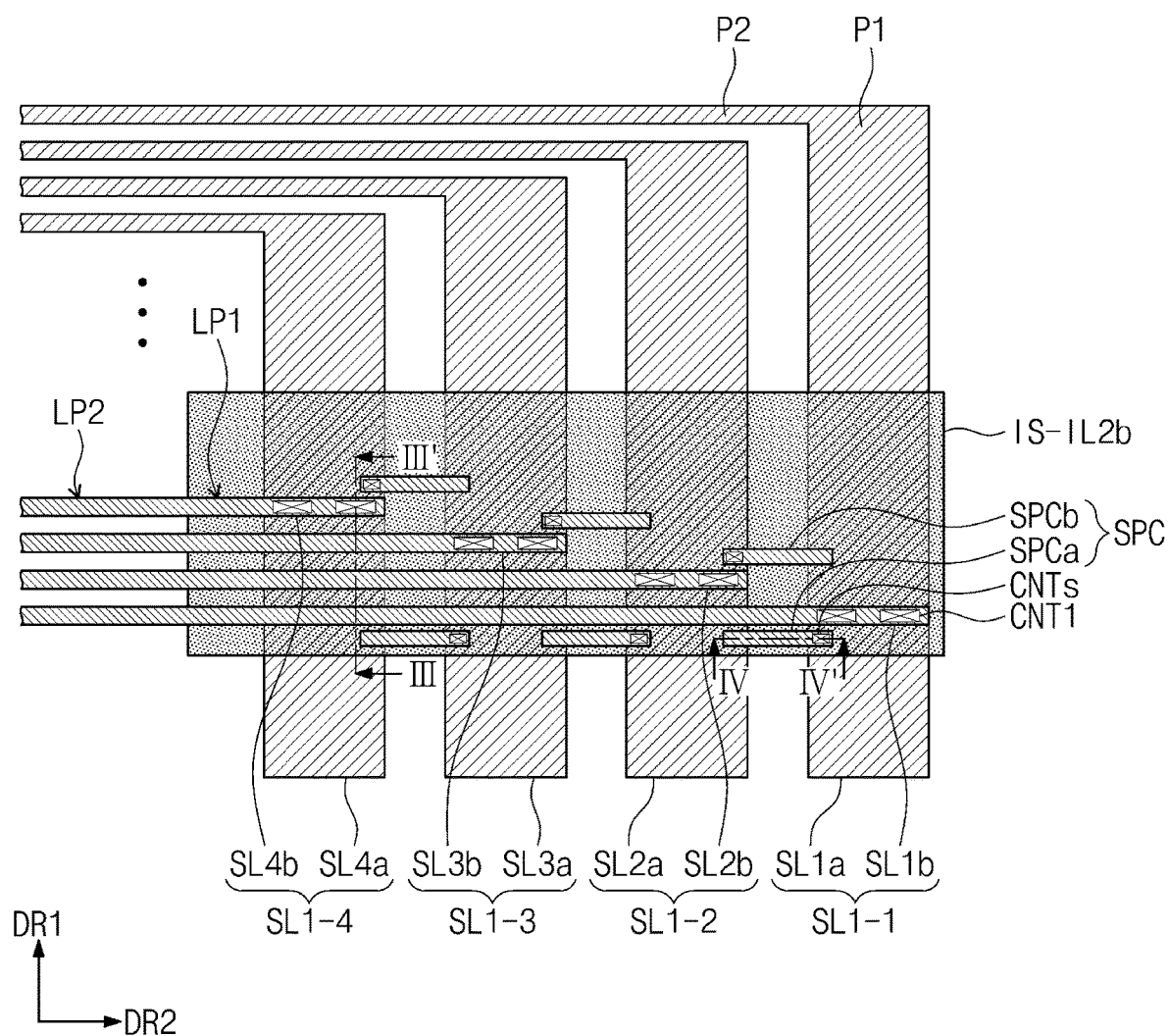
FIG. 9 illustrates an enlarged view showing section IDA of FIG. 5.
Figure 10:
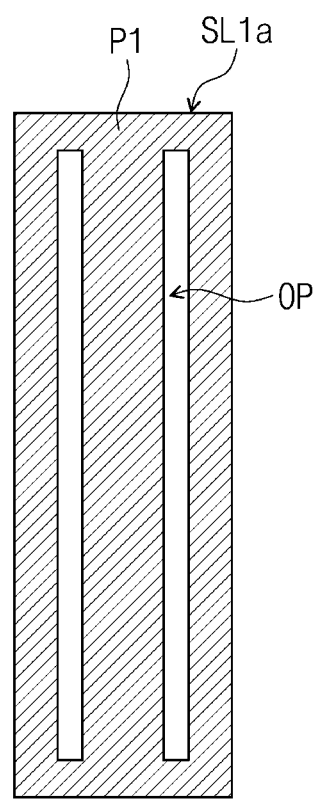
FIG. 10 illustrates a plan view showing first lines according to an embodiment of the present invention.
Figure 10:
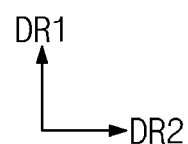
Figure 11:
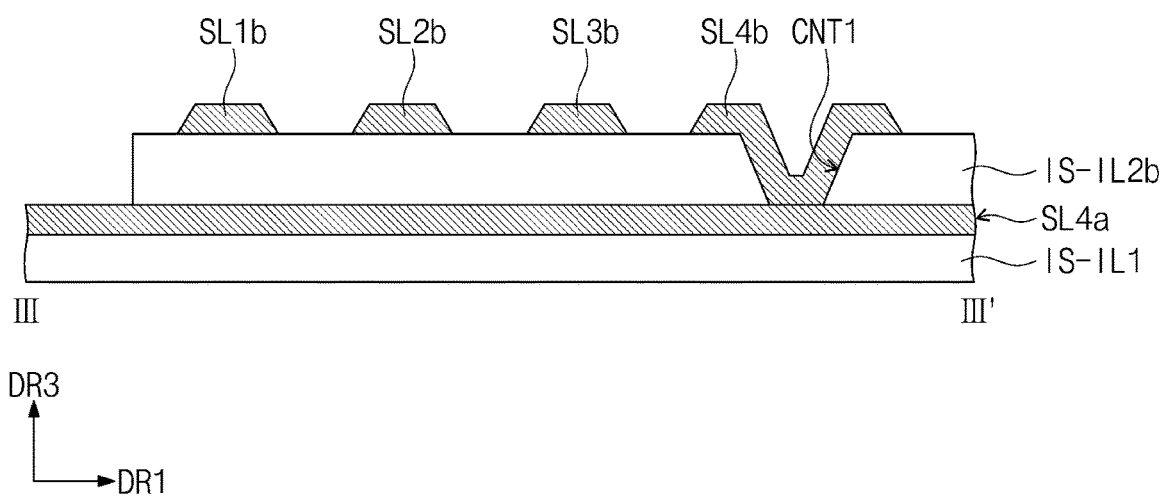
FIG. 11 illustrates a cross-sectional view taken along line III-III' of FIG. 9.
Figure 12:
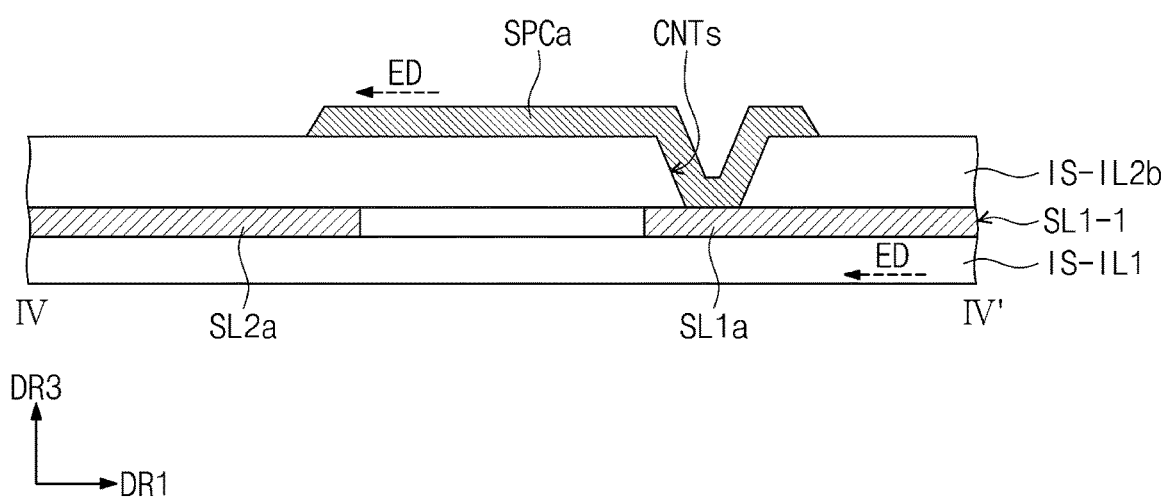
FIG. 12 illustrates a cross-sectional view taken along line IV-IV' of FIG. 9.

FIG. 9 illustrates an enlarged view showing section IDA of FIG. 5. FIG. 10 illustrates a plan view showing first lines according to an embodiment of the present invention. FIG. 11 illustrates a cross-sectional view taken along line III-III' of FIG. 9. FIG. 12 illustrates a cross-sectional view taken along line IV-IV' of FIG. 9.

Referring to FIG. 9, four first sensing lines SL1-1, SL1-2, SL1-3, and SL-4 of the first sensing lines SL1 shown in FIG. 5 are illustrated as an example. The four first sensing lines SL1-1, SL1-2, SL1-3, and SL-4 may be provided by four first lines SL1a, SL2a, SL3a, and SL4a and four second lines SL1b, SL2b, SL3b, and SL4b. The following will describe in, detail a structure, of a first sensing line SL1-1 of the four first sensing lines SL1-1, SL1-2, SL1-3, and SL-4. The remaining first sensing lines SL1-2, SL1-3, and SL1-4 may have substantially the same structure as that of the first sensing line SL1-1.

The first line SL1a of the first sensing line SL1-1 may include a first part P1 and a second part P2. According to the present embodiment, the first part P1 may have a first planar area per unit length, and the second part P2 may have a second planar area per unit length. The second planar area is less than the first planar area.

Referring to FIG. 10, the first part P1 may include at least one opening OP formed therein. In this description, the first part P1 includes two openings OP that are spaced apart from each other, as an example. For example, the opening OP may have a shape that extends in the first direction DR1, or in a longitudinal direction of the first part P1. The opening OP formed in the first part P1 may reduce coupling between the first line SL1a and a subsequently explained second line that overlaps at least a portion of the first part P1 of the first line SL1a of the first sensing line SL1-1.

Referring back to FIG. 9, the second insulation part (see IS-IL2b of FIG. 6) may be disposed between the first part P1 of the first line SL1a and the second line SL1b. The first part P1 of the first line SL1a may be electrically connected to the second line SL1b through at least one contact hole CNT1 formed in the second insulation part IS-IL2b. For example, the first part P1 may be connected to the second line SL1b through two contact holes CNT1.

According to the present embodiment, the second line SL1b may have a structure that overlaps a portion of the first part P1 of the first line SL1a. In addition, the second line SL1b may intersect the first part P1 of each of the remaining first lines SL2a, SL3a, and SL4a. The second line SL1b may be insulated from the first part P1 of each of the remaining first lines SL2a, SL3a, and SL4a because of the second insulation part IS-IL2b.

As discussed above with reference to FIG. 5, the second line SL1b includes a first line part LP1 and a second line part LP2. The first line part LP1 is disposed on the second insulation part IS-IL2b, and the second line part LP2 is disposed on the first sensing insulation layer IS-IL1. For example, the second insulation part IS-IL2b of the second sensing insulation layer IS-IL2 may be an insulation layer to prevent electrical shorts between a plurality of first lines and at least one second line that intersects the plurality of first lines.

Referring to FIG. 11, a structure of a first sensing line SL1-4 of the first sensing lines SL1-1, SL1-2, SL1-3, and SL1-4 is illustrated. According to that shown in FIG. 11, the first line SL4a of the first sensing line SL1-4 may be electrically connected to the second line SL4b of the first sensing line SL1-4 through the first contact hole CNT1 formed in the second insulation part. IS-IL2b of the second sensing insulation layer IS-IL1. In this case, the second lines SL1b, SL2b, and SL3b of the remaining first sensing lines SL1-1, SL1-2, and SL1-3 may be insulated from the first line SL4a because of the second insulation part IS-IL2b.

Referring again to FIG. 9, the electrostatic shield pattern SPC is disposed on the second insulation part IS-IL2b, and includes at least one first electrostatic shield pattern SPCa and at least one second electrostatic shield pattern SPCb. In this description, according to an embodiment of the present invention four first electrostatic shield patterns SPCa and four second electrostatic shield patterns SPCb are illustrated.

The first electrostatic shield pattern SPCa may be closer than the second electrostatic shield pattern SPCb to the second ends of the first lines SL1a, SL2a. SL3a, and SL4a. The second electrostatic shield pattern SPCb may be closer than the first electrostatic shield pattern SPCa to the sensing area (see AR of FIG. 5).

According to the present embodiment, the first electrostatic shield pattern SPCa and the second electrostatic shield pattern SPCb may have therebetween at least one corresponding second line of the second lines SL1b, SL2b, SL3b, and SL4b. For example, according to that shown in FIG. 9, one second line SL1b may be disposed between the first and second electrostatic shield patterns SPCa and SPCb that are positioned at a right side nearest the first sensing line SL1-1, in addition, four second lines SL1b, SL2b, SL3b, and SL4b may be disposed between the first and second electrostatic shield patterns SPCa and SPCb that are positioned at a left side nearest the first sensing line SL1-4.

The following will focus on the first electrostatic shield pattern SPCa and the second electrostatic shield pattern SPCb that are disposed across the second line SL1b.

The second insulation part IS-IL2b may be provided on the first sensing insulation layer IS-IL1 with the first electrostatic shield pattern SPCa that is closer to the second end of the first line SL1a than the second shield pattern SPCb. As a result, external electrostatic charges transferred through the second end of the first line SL1a may be transmitted not to the second line SL1b but to the first electrostatic shield pattern SPCa.

In an embodiment of the present invention, an end of the first electrostatic shield pattern SPCa is electrically connected to the first line SL1a through a guide contact hole CNTs formed in the second insulation part IS-IL2b. Another end of the first electrostatic shield pattern SPCa may have a structure that is disposed on the second insulation part IS-IL2b and is spaced apart from the second lines SL1b to SL4b. For example, the other end of the first electrostatic shield pattern SPCa may have a structure that overlaps a different first line SL2a adjacent to the first line SL1a. For another example, the other end of the first electrostatic shield pattern SPCa may overlap an area between two neighboring first lines.

The second electrostatic shield pattern SPCb may have substantially the same structure as that of the first electrostatic shield pattern SPCa. For example, the second electrostatic shield pattern SPCb may be closer than the second line SL1b to the sensing area AR, and may prevent the second part P2 from receiving external electrostatic charges through the first part P1 of the first line SL1a.

In an embodiment of the present invention, an end of the second electrostatic shield pattern SPCb is electrically connected to the first line SL2a through the guide contact hole CNTs formed in the second insulation part IS-IL2b. Another end of the second electrostatic shield pattern SPCb may have a structure that is disposed on the second insulation part IS-IL2b and is spaced apart from the second lines SL1b to SL4b.

Referring to FIG. 12, the first electrostatic shield pattern SPCa may be disposed on the second insulation part IS-IL2b. The end of the first electrostatic shield pattern SPCa is electrically connected to the first line SL1a through the guide contact hole CNTs formed in the second insulation part IS-IL2b. The other end of the first electrostatic shield pattern SPCa may be disposed on the second insulation part IS-IL2b, thereby overlapping a different first line SL2a adjacent to the first line SL1a.

External electrostatic charges ED transferred through the other end of the first line SL1a may be transmitted through the guide contact hole CNTs to the other end of the first electrostatic shield pattern SPCa disposed on the second insulation part IS-IL2b. In this case, the external electrostatic charges ED may damage the other end of the first electrostatic shield pattern SPCa. However, the other end of the first electrostatic shield pattern SPCa may have a structure spaced apart from the second lines SL1b to SL4b, and may be insulated through the second insulation part IS-IL2b from the remaining first lines SL2a to SL4a. Therefore, even when the external electrostatic charges ED damage the other end of the first electrostatic shield pattern SPCa, it may be possible to prevent damage to sensing lines that transfer drive signals to sensing electrodes.

According to an embodiment of the present invention, an electronic panel includes an electrostatic shield pattern that can prevent sensing lines from being damaged due to external electrostatic charges. Because the electrostatic shield pattern prevents damage to the sensing lines, the electronic panel may increase in driving reliability.

While the present invention has been described with reference to embodiments thereof, it will be understood by those of ordinary skill in the art that various changes in form and details may be made thereto without departing from the spirit and scope of the present invention.

What is claimed is:

1. An electronic panel, comprising:
   a plurality of sensing electrodes that overlap a sensing area;
   a line section that overlaps a peripheral area adjacent to the sensing area, wherein the line section includes a plurality of first lines and a plurality of second lines, wherein the plurality of first lines are respectively connected to first ends of the plurality of sensing electrodes, and the plurality of second lines are respectively connected to second ends of the plurality of sensing electrodes;
   an insulation layer disposed between the plurality of first lines and the plurality of second lines, wherein the insulation layer defines a plurality of contact holes through which the plurality of first lines are electrically connected to a corresponding one of the plurality of second lines; and
   an electrostatic shield pattern disposed on the insulation layer on which the plurality of second lines are disposed, wherein the electrostatic shield pattern is electrically connected to one of the plurality of first lines through a guide contact hole defined in the insulation layer.

2. The electronic panel of claim 1, wherein
   a first end of the electrostatic shield pattern is electrically connected to the one of the plurality of first lines, and
   a second end of the electrostatic shield pattern overlaps a different first line adjacent to the one of the plurality of first lines.

3. The electronic panel of claim 1, wherein the electrostatic shield pattern includes a first electrostatic shield pattern and a second electrostatic shield pattern,
   wherein, at least one second line electrically connected to a first line is disposed between the first electrostatic shield pattern and the second electrostatic shield pattern.

4. The electronic panel of claim 1, wherein the electrostatic shield pattern is disposed on the insulation layer, and the electrostatic shield pattern and the plurality of second lines are formed of a same material in a same process.

5. The electronic panel of claim 1, wherein each of the plurality of second lines overlaps at least a portion of at least one of the plurality of first lines.

6. The electronic panel of claim 1, further comprising
   a base layer that provides the sensing area and the peripheral area, wherein the plurality of sensing electrodes are disposed on the base layer,
   wherein the insulation layer includes:
      a first insulation part that overlaps the sensing area and covers the plurality of sensing electrodes; and
      a second insulation part that covers the plurality of first lines overlapping the plurality of second lines.

7. The electronic panel of claim 6, wherein, the first insulation part and the second insulation part are spaced apart from each other.

8. The electronic panel of claim 6, wherein each of the plurality of second lines includes:
   a first line part disposed on the second insulation part; and
   a second line part disposed on a layer different from a layer on which the first line part is disposed.

9. The electronic panel of claim 6, wherein each of the plurality of first lines includes:
   a first part that has a first planar area per unit length; and
   a second part that has a second planar area per unit length, wherein the second planar area is less than the first planar area.

10. The electronic panel of claim 9, wherein the insulation layer overlaps the first part and does not overlap the second part.

11. The electronic panel of claim 9, wherein the first part includes at least one opening that extends in a longitudinal direction of the plurality of first lines.

12. The electronic panel of claim 6, wherein the plurality of sensing electrodes and the plurality of first lines are formed in the same process and are disposed on the base layer.

13. The electronic panel of claim 1, wherein
   the sensing electrodes and the plurality of first lines include indium tin oxide (ITO), and
   the plurality of second lines and the electrostatic shield pattern include metal.

14. A display device, comprising:
   a display panel; and
   an input sensing layer disposed on the display panel, wherein the input sensing layer defines a sensing area and a peripheral area adjacent to the sensing area,
   wherein the input sensing layer includes:
      a first insulation layer disposed on the display panel;
      a plurality of sensing, electrodes that overlap the sensing area and are disposed on the first insulation layer;
      a plurality of first lines that overlap the peripheral area and are disposed on the first insulation layer, wherein the plurality of first lines are respectively connected to first ends of the plurality of sensing electrodes;
      a second insulation layer that includes a first insulation part and a second insulation part, wherein the first insulation part overlaps the sensing area, and the second insulation part overlaps the peripheral area, wherein the second insulation part covers at least a portion of the plurality of first lines;
      a plurality of second lines including a first line part and a second line part, wherein the first line part is disposed on the second insulation part, and the second line part is disposed on the first insulation layer, wherein a plurality of first line parts are electrically connected to a corresponding one of the plurality of second lines through a plurality of contact holes defined in the second insulation part, and a plurality of second line parts are respectively connected to second ends of the plurality of sensing electrodes; and
      an electrostatic shield pattern disposed on the second insulation part and electrically connected to one of the plurality of first lines through a first guide contact hole defined in the second insulation part.

15. The display device of claim 14, wherein the electrostatic shield pattern includes a first electrostatic shield pattern and a second electrostatic shield pattern that are spaced apart from each other across the plurality of second line parts,
   wherein the second electrostatic shield pattern is closer than the first electrostatic shield pattern to the sensing area.

16. The display device of claim 15, wherein a second guide contact hole is formed in the second insulation part,
wherein the first electrostatic shield pattern is electrically connected through the first guide contact hole to the one of the plurality of first lines, and
wherein the second electrostatic shield pattern is electrically connected through the second guide contact hole to a different first line of the plurality of first lines adjacent to the one of the plurality of first lines.

17. The display device of claim 14, wherein
a first end of the electrostatic shield pattern is connected through the first guide contact hole to the one of the plurality of first lines, and
a second end of the electrostatic shield pattern overlaps a different first line of the plurality of first lines adjacent to the one of the plurality of first lines.

18. The display device of claim 14, wherein
the plurality of sensing electrodes and the plurality of first lines are formed in a same process and are disposed on the first insulation layer, and
the electrostatic shield pattern and the plurality of second lines are formed in a same process and are disposed on the second insulation layer.

19. The display device of claim 14, wherein each of the plurality of first lines includes:
a first part that has a first planar area per unit length; and
a second part that has a second planar area per unit length, wherein the second planar area is less than the first planar area,
wherein the plurality of second parts are respectively connected to the second ends of the plurality of sensing electrodes, and
wherein the plurality of first parts overlap the second insulation part.

20. The display device of claim 14, wherein, at least one of the plurality of second lines intersects at least one of the plurality of first lines.

* * * * *